(12) United States Patent
Mirchandani et al.

(10) Patent No.: US 10,529,845 B2
(45) Date of Patent: Jan. 7, 2020

(54) SEMICONDUCTOR DEVICE

(71) Applicant: Infineon Technologies Austria AG, Villach (AT)

(72) Inventors: Ashita Mirchandani, Torrance, CA (US); Thomas Feil, Villach (AT); Maximilian Roesch, St. Magdalen (AT); Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/916,804

(22) Filed: Mar. 9, 2018

(65) Prior Publication Data

US 2019/0280117 A1    Sep. 12, 2019

(51) Int. Cl.
| | | |
|---|---|---|
| *H01L 29/78* | (2006.01) | |
| *H01L 29/08* | (2006.01) | |
| *H01L 29/40* | (2006.01) | |
| *H01L 29/10* | (2006.01) | |

(52) U.S. Cl.
CPC ...... *H01L 29/7811* (2013.01); *H01L 29/0869* (2013.01); *H01L 29/1095* (2013.01); *H01L 29/405* (2013.01); *H01L 29/407* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 2009/0090967 A1 | 4/2009 | Chen et al. | |
| 2010/0019314 A1 | 1/2010 | Kachi | |
| 2012/0153386 A1* | 6/2012 | Hirler | H01L 29/7801 257/334 |
| 2013/0168761 A1* | 7/2013 | Hsieh | H01L 29/407 257/330 |
| 2014/0097863 A1* | 4/2014 | Zundel | H01L 22/34 324/762.01 |
| 2016/0064546 A1 | 3/2016 | Zitouni et al. | |
| 2016/0104773 A1 | 4/2016 | Kelkar et al. | |
| 2017/0170274 A1 | 6/2017 | Wutte et al. | |
| 2018/0114857 A1* | 4/2018 | Okada | H01L 29/78 |

FOREIGN PATENT DOCUMENTS

DE    102015200809 A1    7/2016

* cited by examiner

*Primary Examiner* — Dung A. Le
(74) *Attorney, Agent, or Firm* — Murphy, Bilak & Homiller, PLLC

(57) ABSTRACT

In an embodiment, a semiconductor device includes a semiconductor body having a field effect transistor device with an active region and an edge termination region that surrounds the active region on all sides. The active region includes a first serpentine trench in the semiconductor body, a first field plate in the first serpentine trench, a second serpentine trench in the semiconductor body, and a second field plate in the second serpentine trench. The first serpentine trench is separate and laterally spaced apart from the second serpentine trench.

20 Claims, 9 Drawing Sheets

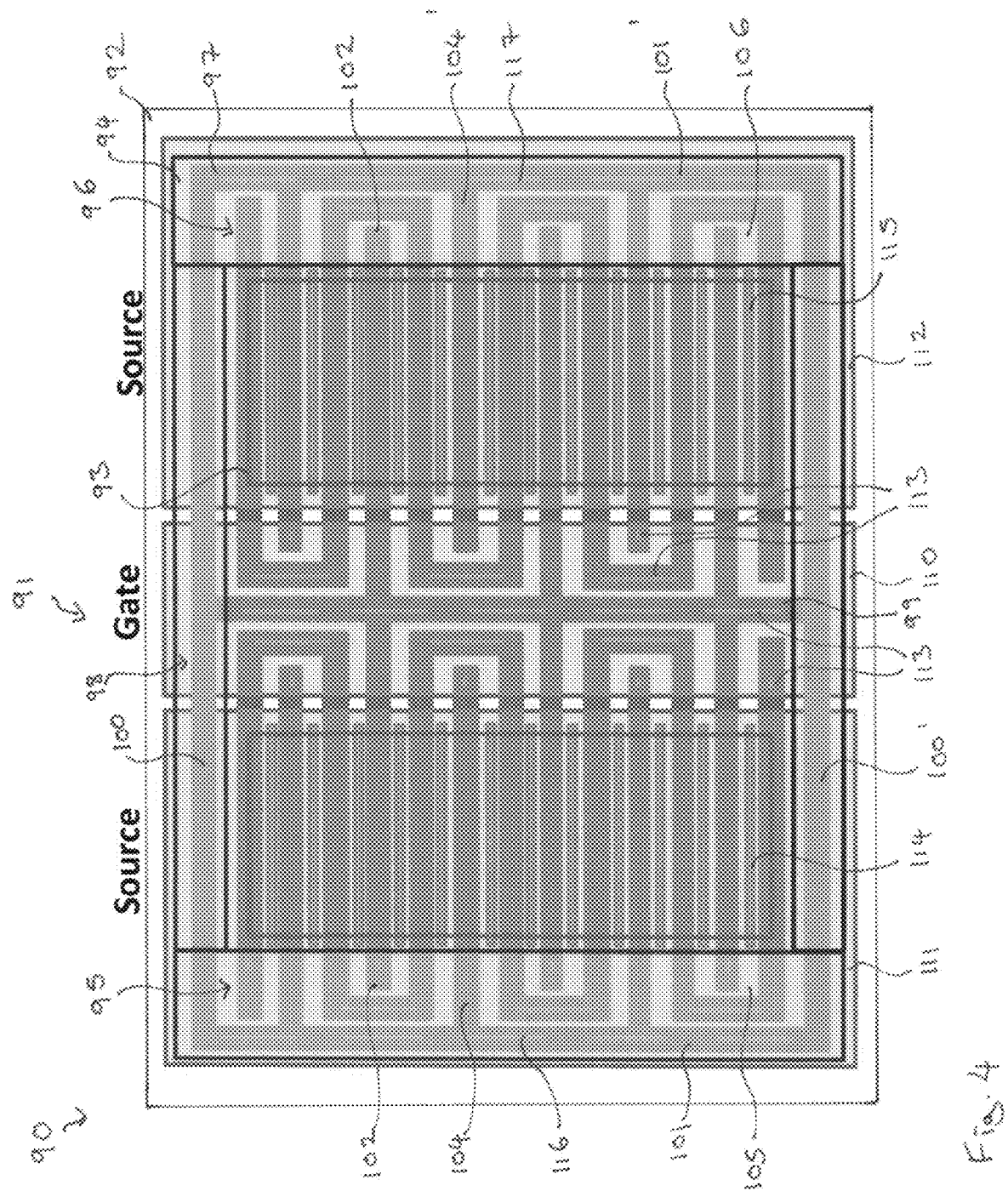

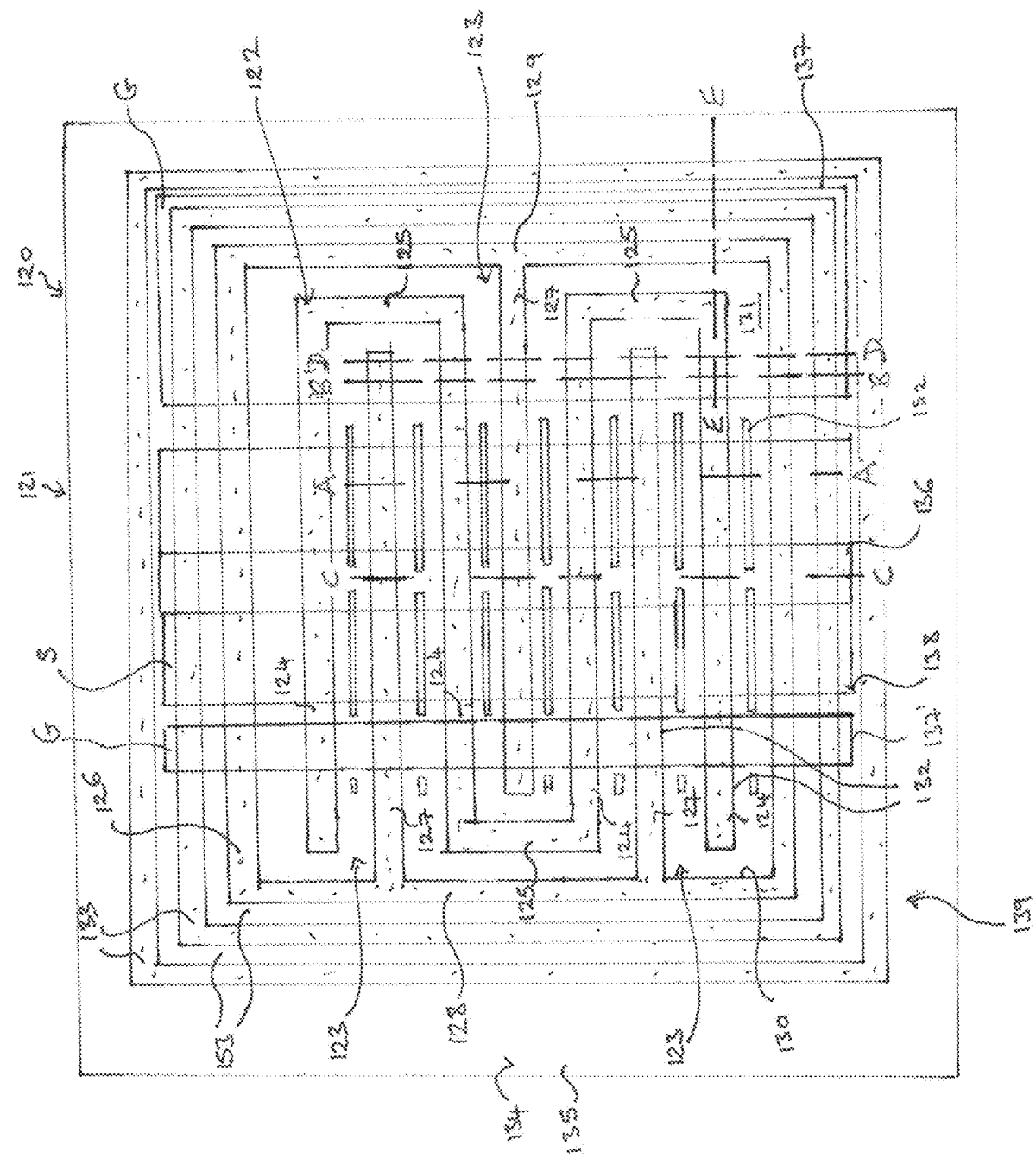

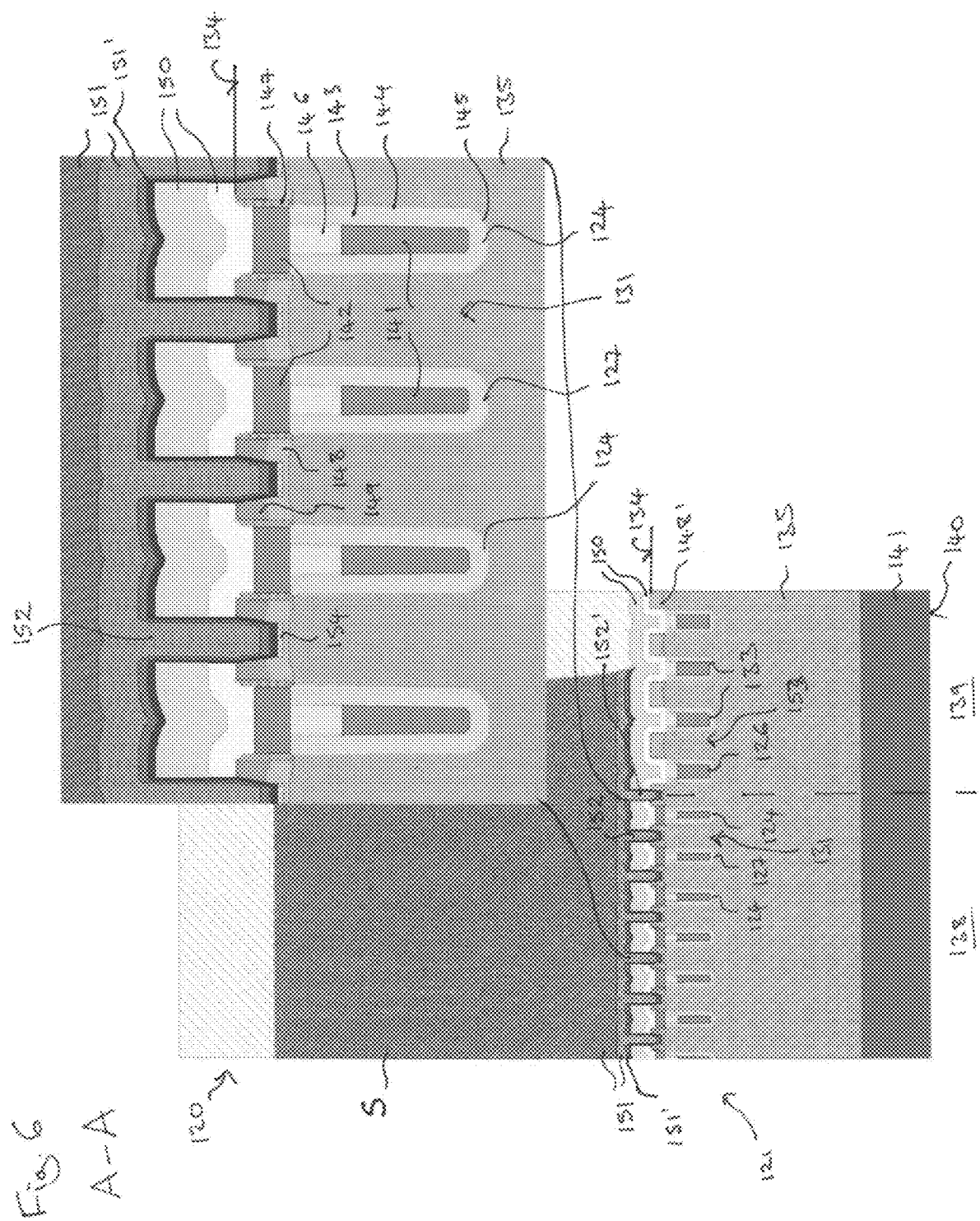

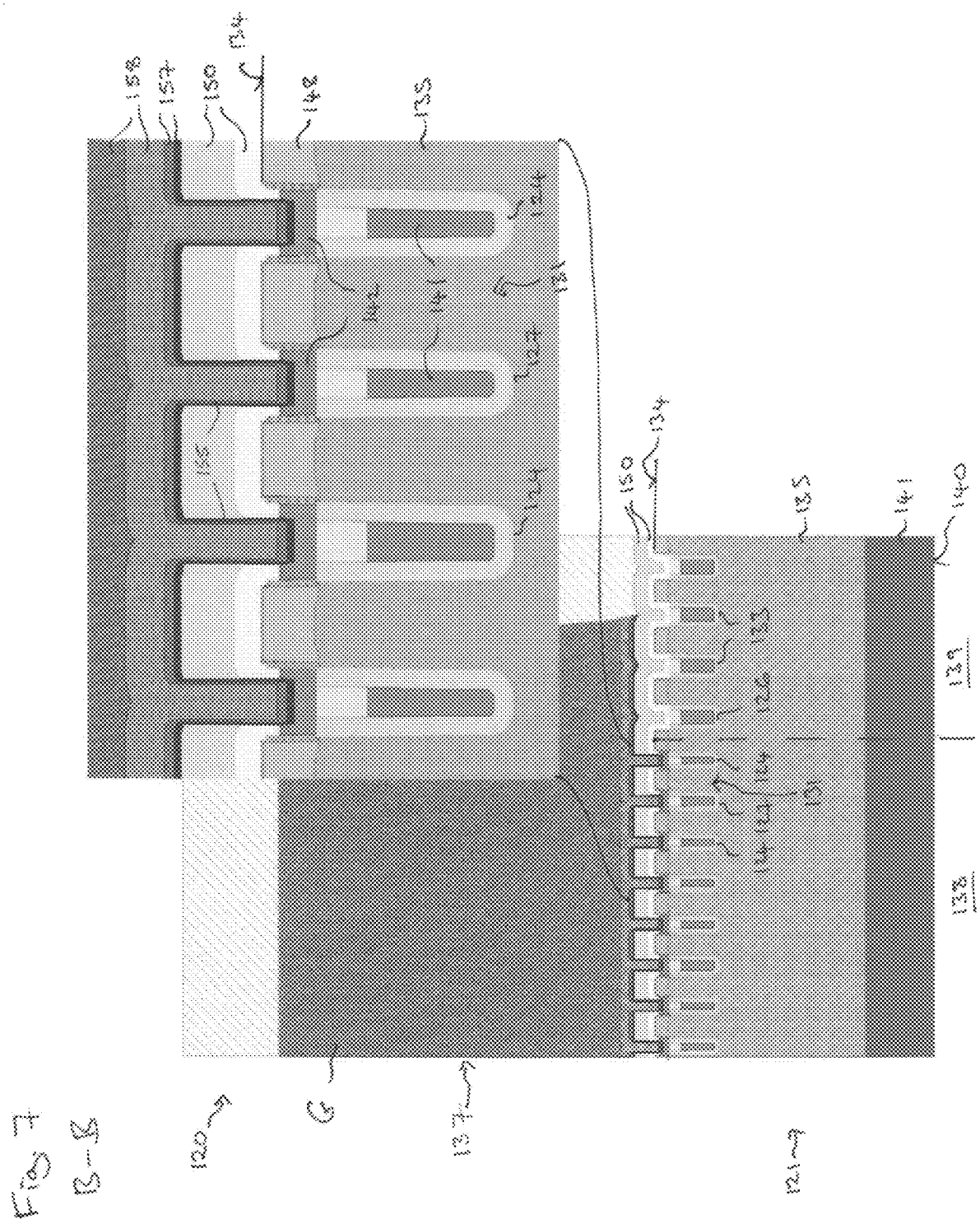

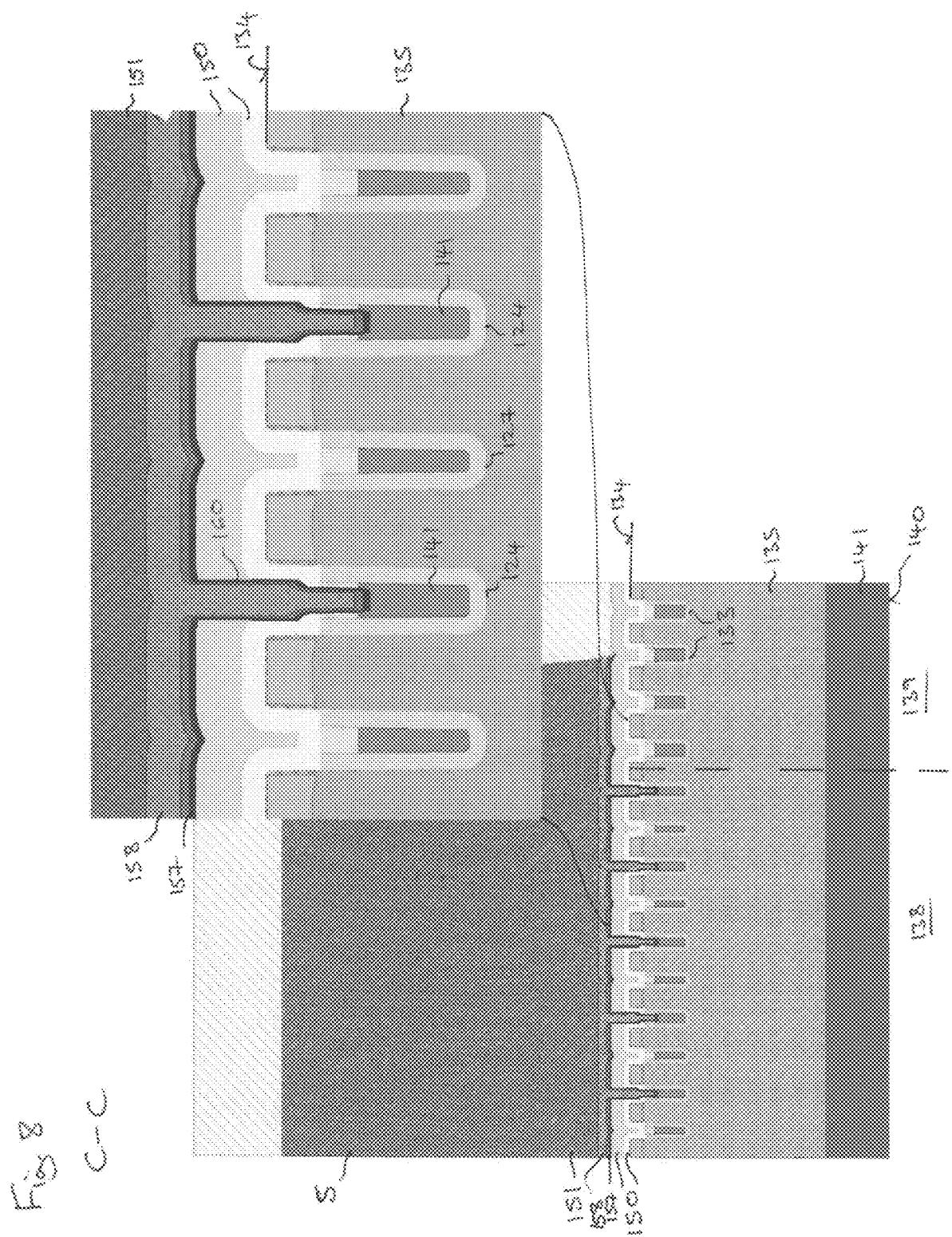

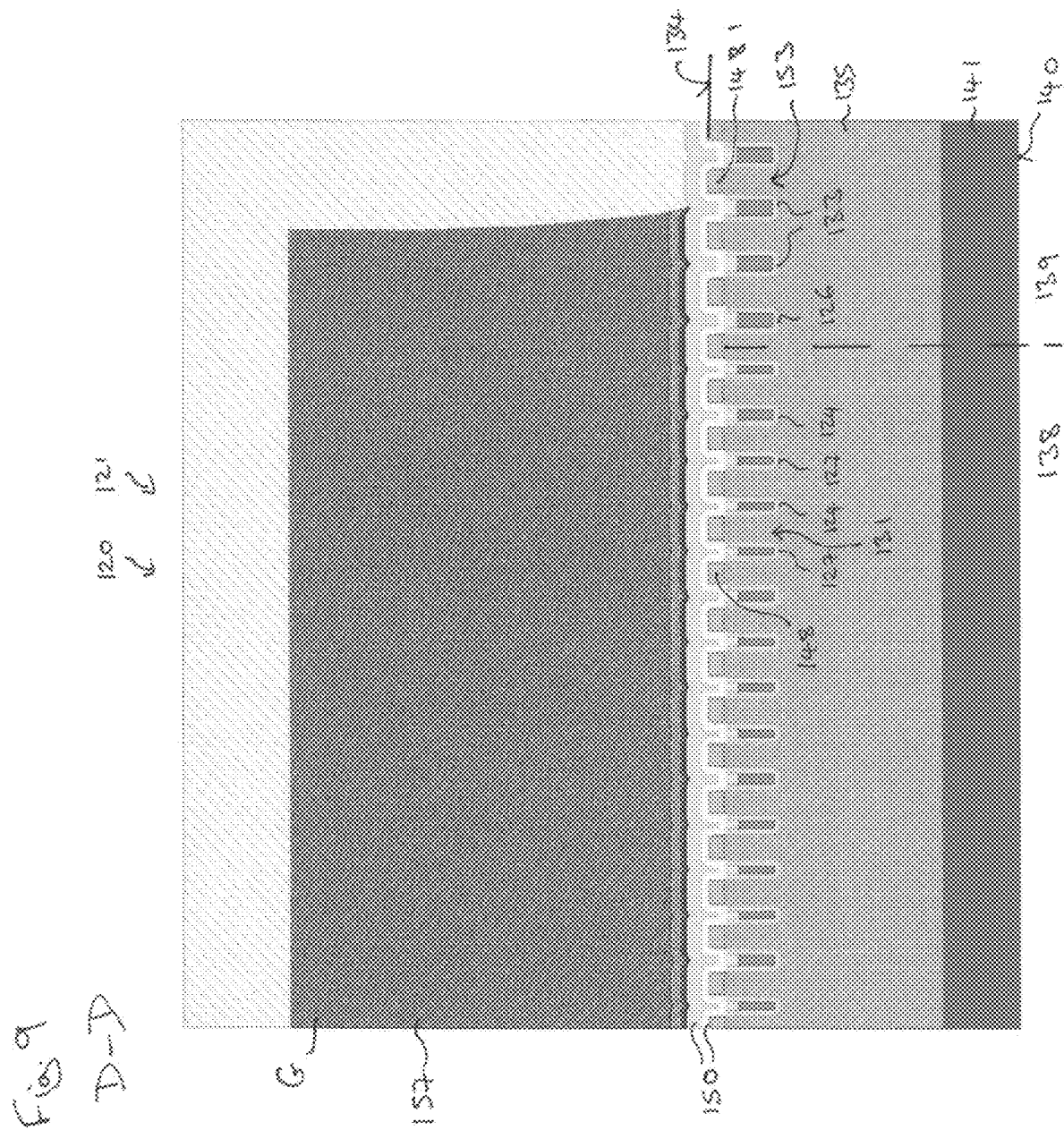

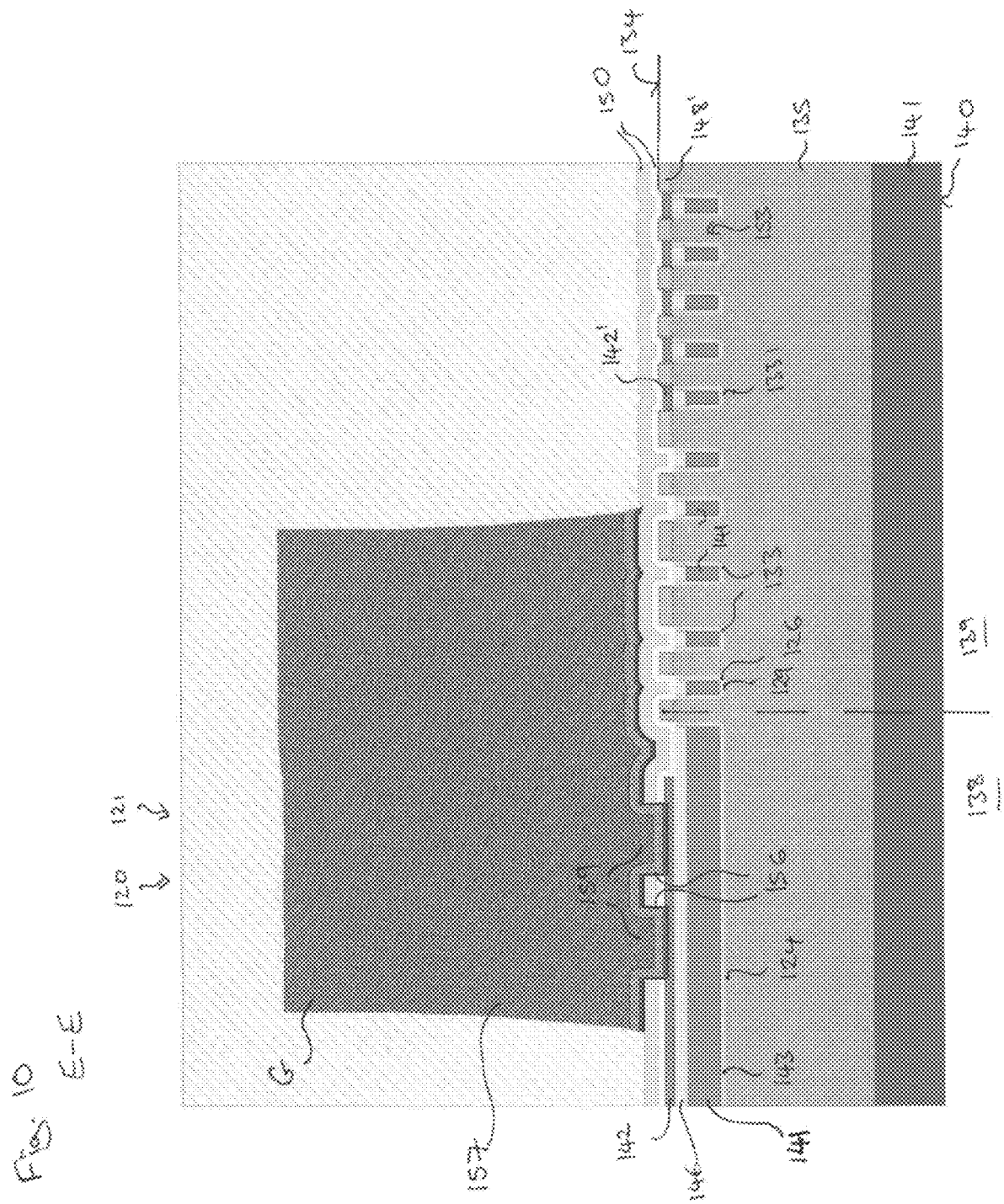

US 10,529,845 B2

SEMICONDUCTOR DEVICE

BACKGROUND

A metal oxide semiconductor field effect transistor (MOSFET) commonly includes an active area which contributes to the conduction of the transistor device and an edge termination region around the perimeter of the transistor, surrounding the active area. The edge termination area typically includes an edge termination structure which is designed to have the same or higher breakdown capability as the active area transistor.

US patent application US 2009/0090967 A1 discloses a MOSFET device with active area and edge termination area charge balance to provide uniform voltage breakdown across the active and termination area, whilst obtaining a suitably low drain source on resistance (RDSon).

However, further improvements to transistor device structures and edge termination structures are desirable in order to produce more reliable transistor devices with good performance.

SUMMARY

In an embodiment, a semiconductor device includes a transistor device. The transistor device includes a semiconductor body having a first major surface, a first trench in the first major surface, the first trench having at least two transverse portions that are spaced apart by a distance, whereby adjacent ones of the transverse portions are connected by a longitudinal portion such that the first trench has a meandering form, a second trench in the first major surface, the second trench laterally enclosing the first trench and a third trench in the first major surface, wherein the third trench extends from the second trench between two transverse portions of the first trench and has a distal end spaced apart from the longitudinal portion of the first trench that connects the two transverse portions. A continuous mesa is formed between the first trench, the second trench and the third trench. A field plate and a gate electrode, that is electrically isolated from the field plate, are arranged in the first trench and in the third trench. A field plate may also be arranged in the second trench.

In an embodiment, a semiconductor device includes a semiconductor body including a field effect transistor device that includes an active region and an edge termination region that surrounds the active region. The active region includes a first serpentine trench in the semiconductor body and a first field plate arranged in the first serpentine trench, a second serpentine trench in the semiconductor body and a second field plate arranged in the second serpentine trench. The first serpentine trench is separate and laterally spaced apart from the second serpentine trench.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 4 illustrates a top view of a semiconductor device including a transistor device.

FIG. 5 illustrates a top view of a semiconductor device including a transistor device.

FIG. 6 illustrates a cross-sectional view along the line A-A of the semiconductor device of FIG. 5.

FIG. 7 illustrates a cross-sectional view along the line B-B of the semiconductor device of FIG. 5.

FIG. 8 illustrates a cross-sectional view along the line C-C of the semiconductor device of FIG. 5.

FIG. 9 illustrates a cross-sectional view along the line D-D of the semiconductor device of FIG. 5.

FIG. 10 illustrates a cross-sectional view along the line E-E of the semiconductor device of FIG. 5.

DETAILED DESCRIPTION

Figure 1:
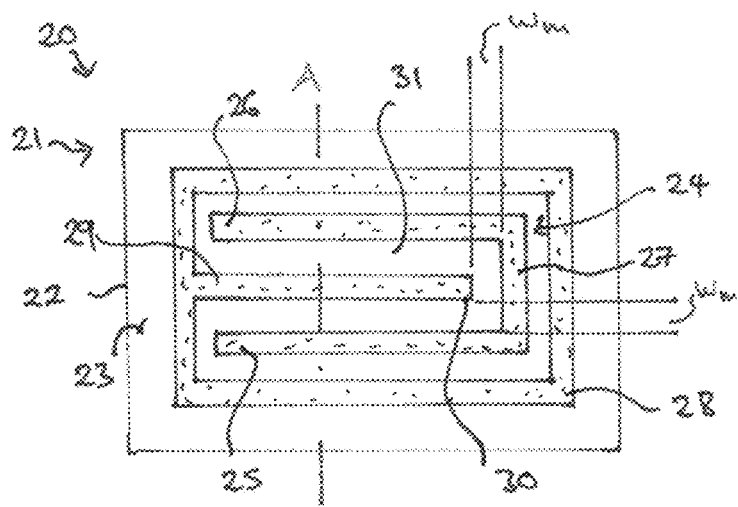
FIG. 1 illustrates a top view of a semiconductor device including a transistor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

To improve performance, trench power MOSFET devices may utilize a charge balancing technique, such as a buried source electrode to maintain a relatively uniform electric field in the drift region. Such a device is capable of achieving a predetermined breakdown voltage rating with higher drift region doping compared to conventional trench devices without charge balancing. However, edge termination poses a challenge in the design of such devices to achieve the same extent of charge balance at the transition region from active area or region to edge termination area or region, as in the bulk of the active area. As a result, the edge termination area may become the limiting factor for breakdown voltage, and device performance often is traded-off, to improve the termination breakdown voltage capability.

In a busied source trench MOSFET, the lower portion of the trench contains a buried electrode or field plate, which is insulated from the epitaxial layer (i.e. drift region) using a field oxide, and which is electrically connected to source potential. For such designs, the active area has a somewhat different mechanism for depletion as compared to the edge termination region during the off-state. In the active area, where there is a plurality of parallel trenches separated by silicon mesas, the mesa drift region gets depleted from two sides due to the bias on the buried electrode in the trenches on either side of the mesa.

In some edge termination designs, parallel active trenches are connected with each other by means of a transverse termination trench. In these designs, the mesa drift region enclosed between the two parallel trenches and the transverse termination trench gets depleted faster than the active area, due to depletion extending from three sides. This results in the termination region having a lower breakdown voltage compared to the active area.

In embodiments described herein, a meander or serpentine trench layout is used to improve the termination breakdown voltage capability of the buried field plate device. This design includes of an array of interdigitated serpentine trenches, with uniform spacing between the trenches maintained throughout the entire chip. In this configuration, the depletion behavior of the drift region at the edge termination area is substantially identical to the depletion behavior of the drift region in the bulk of the active area. As a result, the termination area breakdown is not degraded as compared to the breakdown of the active area which enables a more uniform avalanche current distribution across the entire chip and an improved device reliability and improved RDSON to breakdown ratio.

Figure 2:
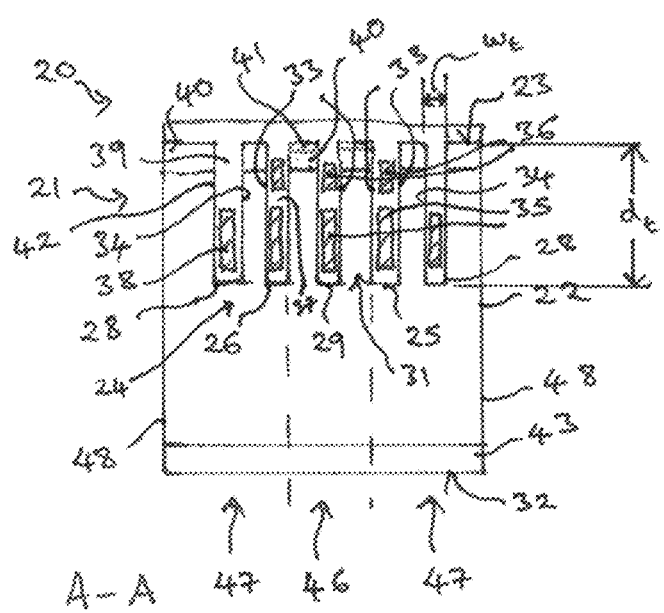
FIG. 2 illustrates a cross-sectional view along the line A-A of the semiconductor device of FIG. 1.

FIG. 1 illustrates a top view and FIG. 2 illustrates a cross-sectional view along the line A-A of a semiconductor device 20 including a transistor device 21 according to an embodiment. The transistor device 21 includes a semiconductor body 22 having a first major surface 23. The transistor device 21 includes a first trench 24 arranged in the first major surface 23. The first trench 24 includes at least two transverse portions 25, 26 which are spaced apart by a distance. The at least two portions 25, 26 of the first trench 24 are transverse in that they each extend from one side of the first trench 24 (e.g. the left-hand side in FIG. 1) to the other side of the first trench 24 (e.g. the right-hand side in FIG. 1). Adjacent ones of the transverse portions 25, 26 are connected by a longitudinal portion 27 that runs lengthwise rather than across the first trench 24, such that the first trench 24 has a meandering (meandrous) form.

In the arrangement illustrated in FIG. 1, the first trench 24 may be considered to have a U-form which provides a single loop of a meandering form. The transistor device 21 further includes a second trench 28 in the first major surface 23 which laterally encloses the first trench 24. The second trench 28 has a continuous loop form and may have a substantially square or rectangular form in plan view. The second trench 28 is spaced apart from the first trench 24 by a portion of the semiconductor body 22. The transistor device 21 includes at least one third trench 29 in the first major surface 23. The third trench 29 extends from the second trench 28 between two transverse portions 25, 26, of the first trench 24 into the open end of the loop and has a distal end 30 which is spaced apart from the longitudinal portion 27 of the first trench 24 that connects these two transverse portions 25, 26 and provides the closed end to the loop. The lateral arrangement of the first trench 24, the second trench 28 and third the trench 29 in the first major surface 23 defines a continuous and uninterrupted mesa 31 which is formed between facing sides walls of the first trench 24, the second trench 28 and the third trench 29.

The lateral arrangement of the first trench 24, the second trench 28 and the third trench 29 as well as the position of the distal end 30 of the third trench 29 and its spacing from the longitudinal portion 27 of the first trench 24 may be selected such that the continuous mesa 31 has a width $w_m$ which is substantially the same throughout its length. For example, the width $w_m$ of the continuous mesa 31 at any one point may have a width variation from its nominal width $w_{m\,(nom)}$ that is less than around 10% of its nominal width $w_{m\,(nom)}$.

As can be seen in the cross-sectional view of FIG. 2, the first trench 24, the second trench 28 and the third trench 29 extend from the first major surface 23 into the semiconductor body 22 in the direction of a second major surface 32 of the semiconductor body 22 which opposes the first major surface 23. The first trench 24, the second trench 28 and the third trench 29 extend into the first major surface 23 of the semiconductor body 22 to a depth $d_t$, which in the illustrated embodiment is substantially the same for all the trenches. Each of these trenches 24, 28, 29 has a width $w_t$ which is in this embodiment also substantially the same for all the trenches. Each trench 24, 28 and 29 includes sidewalls which are substantially perpendicular to the first major surface 23. The inner sidewall 34 of the second trench 28 and sidewall 33 of the first trench 24 which faces the inner sidewall 34 of the second trench 28 as well as the sidewalls 33 of the first trench 24 and the third trench 29 which face one another and define the mesa 31 having a width wm which is substantially the same throughout its length.

The width of the continuous mesa 31 formed between the trenches is substantially the same throughout its length. In some embodiments, the trenches 24, 28, 29 may have different widths, but the width of the continuous mesa 31 formed between them is substantially invariable. For example, the second trench 28 may be wider than the first and third trenches 24, 29.

As can be seen in the cross-sectional view of FIG. 2, the first trench 24 includes a field plate 35, which is arranged towards the bottom of the trench, and a gate electrode 36 that is electrically isolated from the field plate 35 within that trench. The third trench 29 also includes a field plate 35 arranged towards the bottom of the trench and a gate electrode 36 that is arranged towards the top of the trench and that is electrically isolated from the field plate 35 within that trench. The gate electrode 36 may be arranged in the upper portion of the first trench 24 and in the upper portion of the third trench 29 and be spaced apart from the underlying field plate 35 by insulating material 37. Each of the first and third trenches 24, 29 is lined with insulating material so that the field plate 35 and gate electrode 36 are electrically insulated from the semiconductor body 22.

The second trench 28 also includes a field plate 38 which is arranged towards the bottom of the trench and insulating material 39 that electrically insulates the field plate 38 from the semiconductor body 22. The second trench 28 does not include a gate electrode in order that an electrical contact may be made to the field plate. In the second trench, the insulating material may extend from the field plate 38 to the first major surface 23 and fill the remainder of the second trench 28.

All of the trenches 24, 28, 29 include a field plate 35, 38 whereas a gate electrode may be positioned in only some of the trenches, for example in only the first and third trenches 24, 29. The second trench 28 may include only a single electrode which forms a field plate 38 and no gate electrode.

In some embodiments, the second trench 28 includes only a single electrode which forms a field plate 38 that extends to the first major surface 23. The field plate is electrically insulated from the semiconductor body 22 by insulating material 39 that lines the base and the side walls of the second trench 28 from the base to the first major surface 23.

In some embodiments, the second trench 28 may include a first electrode that forms a field plate 38 and a second electrode that is electrically insulated from the field plate 38. The second electrode may be surrounded by an insulating layer at least on its side faces that is thicker than the insulating layer on the side faces of the gate electrode in the first and third trenches 24, 29. The second electrode in the second trench is not coupled to gate potential.

In plan view, the field plate 38 in the second trench 28 may have a continuous ring form corresponding to the continuous ring form of the second trench 28. The gate electrode 36 in the first trench and the field plate 35 in the first trench may also have a meandering form corresponding to the meandering form of the first trench 24. However, in some embodiments, the field plate 35 has a meandering form corresponding to the meandering form of the first trench 24 whereas the gate 36 is positioned only in some portions of the meandering first trench 24, for example in the transverse portions 25 of the first trench 24. In portions of any of the trenches 24, 28, 29, in which there is no gate electrode, the field plate may extend to the top of the trench in these portions. The field plate 35 and the gate electrode 36 and in the third trench 29 may be substantially linear and extend substantially parallel to the transverse portions 25, 26 and perpendicular to the longitudinal portion 27 of the first trench 24.

The transistor device 21 includes a body region 40 which extends from the first major surface 23 into the semiconductor body 22 and a source region 41 which is arranged in the body region 40. The body region 40 may extend throughout the lateral area of the semiconductor body 22 and throughout the length of the continuous mesa 31, which is defined by the sidewalls 33 of the first trench 24, the third trench 29 and inner sidewall 34 of the second trench 28, as well as in regions of the semiconductor body 22 which are adjacent the outer sidewall 42 of the second trench 28. The source region 41 may be arranged on the body region 40 in regions of the continuous mesa 31 which are arranged between the transverse portions 25, 26 of the first trench 24 and the third trench 29.

The transistor device 21 may also include a drain region 43 arranged at the second major surface 32. In these embodiments, the transistor device 21 can be considered as a vertical device with a vertical drift path extending from the source region 41 to the drain region 43.

The transistor device also includes contacts to the body region 40, gate 36 and field plates 35, 38 which are not illustrated in FIGS. 1 and 2.

The semiconductor body 22 may include silicon in the form of a single crystal silicon wafer or a monocrystalline epitaxially deposited layer (epi layer) on a substrate. The semiconductor body 22 has a first conductivity type, for example n-type, the body region 40 has a second conductivity type which opposes the first conductivity type, for example p-type in embodiments in which the first conductivity type is n-type. The source region 41 and the drain region 43 have the first conductivity type and may be more highly doped than the semiconductor body 22.

The transistor device 21 includes an active region or cell field 46 which is defined by the portion of the semiconductor body 22 including source regions 41 and body regions 40. The active region or cell field 46 is laterally surrounded on all sides by an edge termination region 47. The edge termination region 47 does not contribute to current conduction in the on-state operation of the semiconductor device 21 and this portion of the semiconductor body 22 does not include source regions 41. The second trench 28 is positioned in the edge termination region 47. The field plate 42 within the second trench 28 is arranged within the edge termination region 47 and provides a mechanism for reducing the field strength in at least lateral directions from the cell field 46 to the edges 48 of the semiconductor body 22.

The continuous mesa 31 is laterally continuously surrounded by a field plate arranged at the bottom of the first, second and third trenches 24, 28, 29. The continuous mesa 31 can, therefore, be depleted uniformly from all sides so that the depletion behaviour of the transistor device 21 in the active area 46 and in the innermost portion of the edge termination region 47 is more similar and may be substantially the same. Consequently, the difference between the breakdown voltage of the edge termination region 47 and the cell field 46 is reduced which enables a more uniform avalanche current distribution across the entire semiconductor device 20, an improved device reliability and a lower RDSON for the device at a given breakdown voltage.

In practice, the lateral shape of the distal ends of the trenches 24 and of the corners between trenches are rounded rather than perpendicular as shown. The radius of curvature may be selected for processing reasons and/or to further improve the uniformity of the compensation of the mesa.

Figure 3:
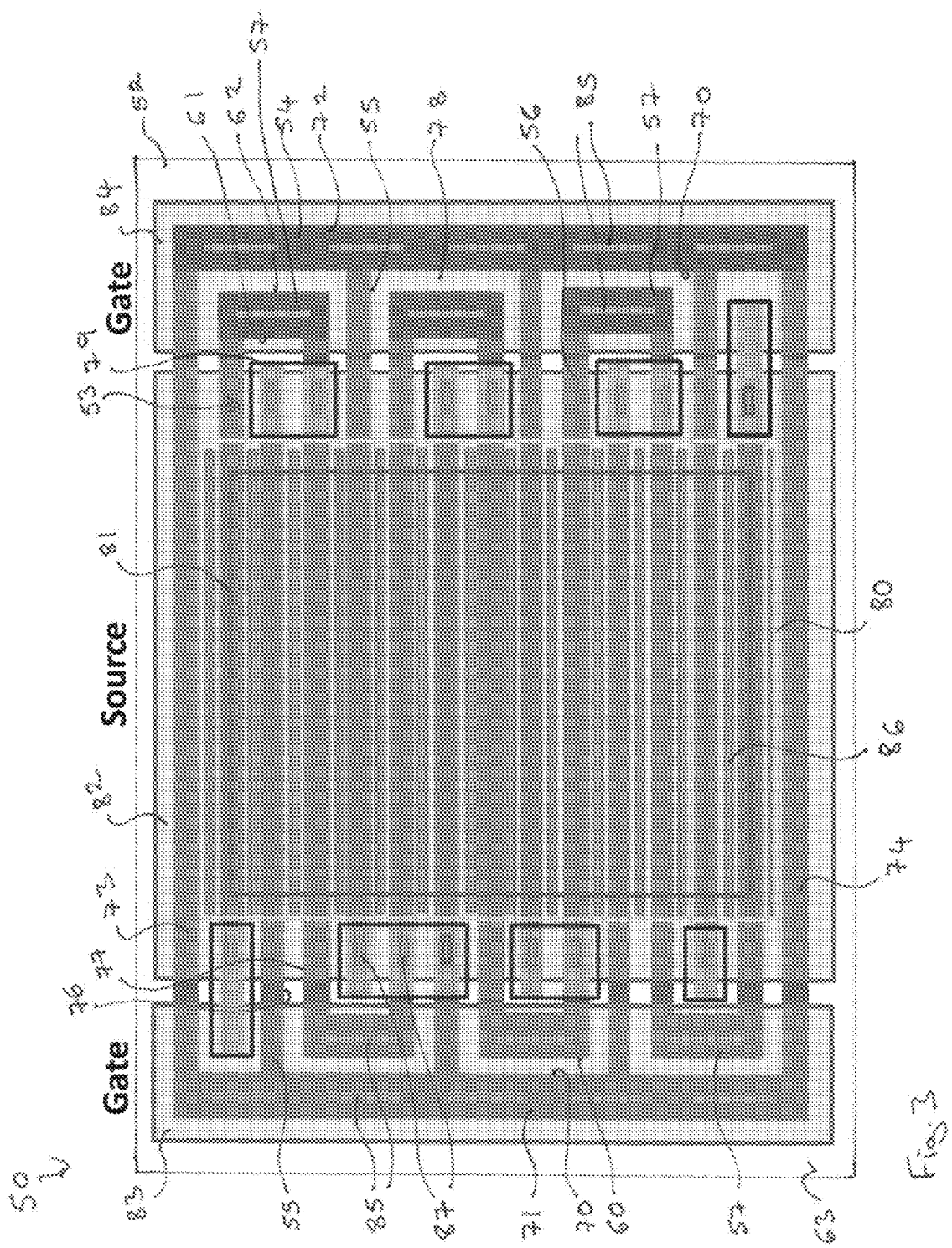
FIG. 3 illustrates a top view of a semiconductor device including a transistor device.

FIG. 3 illustrates a top view of a semiconductor device 50 including a transistor device 51. The transistor device 51 includes a semiconductor body 52, a first trench 53, a second trench 54 and third trenches 55. The first trench 53, second trench 54 and third trenches 55 extend from a first major surface 63 of the semiconductor body 52 into the semiconductor body 52. The first trench 53 includes a plurality of transverse portions 56 and a plurality of longitudinal portions 57. In plan view, the transverse portions 56 and longitudinal portions 57 are substantially orthogonal. The transverse portions 56 are arranged substantially parallel to one another and adjacent ones of the transverse portions 56 are spaced apart by a distance.

The transverse portion 56 may also be curved, for example have a C-shape, and connect to the longitudinal portions 57. The distal end of the third trenches 55 may also be rounded. The rounded ends and rounded distal ends may be formed as a consequence of the fabrication of the trenches.

Adjacent ones of the transverse portions 56 are connected by a longitudinal portion 57 to produce a first trench 53 having a meandering form. The meandering form can also be considered to be a serpentine form. Apart from the laterally outermost ones of the transverse portions 56, a longitudinal portion 57 is arranged at opposing ends of each transverse portion 56 that extends in opposing longitudinal directions to from the serpentine shape. Two transverse portions 56 and the longitudinal portion 57 connecting them can be considered to form an open sided loop having a U-shape in plan view whereby the open-sides of adjacent U-shapes of the trench 54 face in opposing directions to provide the serpentine form.

In plan view, the second trench 54 laterally surrounds the first trench 53 and provides a continuous trench, which in this embodiment is substantially rectangular and has four portions, 71, 72, 73, 74. Sidewalls of two opposing longitudinal portions 71, 72 of the second trench 54 are arranged spaced apart from and substantially parallel with an outer facing sidewall 60 of the longitudinal portions 57 of the first trench 53. The second trench 54 also includes two transverse portions 73, 74 which extend between the two longitudinal portions 71, 72 and which are arranged spaced apart from and substantially parallel to outermost transverse portions 56 of the first trench 53.

The third trenches 55 extend from the inner sidewall 70 of the two longitudinal portions 71, 72 of the second trench 54 into the open-sided loops of the first trench 53 formed by adjacent transverse portions 56 and a connecting longitudinal portion 57. Since the first trench 53 has a meandering form, adjacent ones of the third trenches 55 extend from opposite sides of the longitudinal portions 71, 72 of the second trench 54. The third trenches 55 extend into the loops such that a mesa 78 is formed between the sidewalls 76 of the third trench 55 and sidewalls 77 of the transverse portions 56 of the first trench 54 and such that the mesa 78 is also formed between the distal end 79 of the third trench 55 and the inner wall 61 of the longitudinal portion 57 of the first trench 53. The continuous mesa 78 is also formed between the inner sidewall 70 of the second trench 54 and outer sidewall 60 of the longitudinal portion 57 of the first trench 53 and between the sidewall 77 of the transverse potion 56 of the first trench 53 and sidewall 76 of the third trench 55. The continuous mesa 78 also has a meander or serpentine shape in plan view and can be considered to have interdigitated serpentine forms in plan view.

The first trenches 53, the second trench 54 and the third trenches 55 include a field plate and a gate electrode, which cannot be seen in the plan view of FIG. 3. The gate electrode is electrically insulated from the field plate. In the region within the area indicated in FIG. 3 by line 80, the thickness of the insulative material surrounding the gate electrode is greater than the thickness of the insulative material laterally surrounding the gate electrode in the area laterally outboard of the line 80.

Portions of the continuous mesa 78 formed between the transverse portions 56 of the first trench 53 and the third trenches 55 provide the active area of the transistor device 51 and include body regions and source regions (not seen in the top view of FIG. 3). The position of the source region is indicated by the line 81 defining a substantially rectangular area which extends over portions of the mesa 78 defined by substantially parallel transverse portions 56 of the first trench 53 and the third trench 55. The line 81 indicates the active area of the transistor device 51. The second trench 54 is positioned laterally outside of this area. The edge termination area is the area laterally outwards of the line 81 and contains no source regions.

Metallic layers of the transistor device 51 are illustrated in the top view of FIG. 3. A first metal layer 82 is positioned above the centre portions of the first trench 53, the second trench 54 and the third trenches 55. The first metal layer 82 is coupled to source potential. A second metal layer 83, 84 is arranged laterally adjacent each of the two opposing sides of the first metal layer 82. The second metal layers 83, 84 are laterally spaced apart from the first metal layer 82 and are coupled to the gate electrodes within the first trench 53 and third trench 55.

The field plates within the first trench 53 and the third trench 55 are electrically coupled to the overlying first metal layer 82 by first contacts 87 which extend from the field plate to the overlying first metal layer 82. The lateral position of the first contacts 87 may be at the distal end of the third trenches 55 and in a laterally adjacent region of the transverse portion 56 of the first trench 53. The first contacts 87 may include one or more metal layers which line an opening in one or more insulating layers arranged between the first major surface 63 of the semiconductor body 52 and the first metal layer 82.

The second metal layer 83 is positioned above the longitudinal portions 57 of the first trench 53, above the longitudinal portion 71 of the second trench 54 and above the connection between the third trench 55 and the inner sidewall 70 of the second trench 54. The second metal layer 84 is positioned above the longitudinal portions 57 of the first trench 53, above the longitudinal portion 72 of the second trench 54 and above the connection between the third trench 55 and the inner sidewall 70 of the second trench 54 on the laterally opposing side of the first metal layer 82. Second conductive contacts 85 may be positioned in the longitudinal portions 57 of the first trench 53 in order to electrically couple the gate electrode to the second metal layers 83, 84. The gate electrode in the third trenches 55 may be electrically coupled to the second metal layer 83 by one or more second contact 85 positioned towards the connection between the third trench 55 and the second trench 54 such that the second contact 85 is positioned laterally adjacent the first metal layer 82.

The source region and, therefore, the body region arranged in the continuous mesa 78 may be coupled to the overlying first metal layer 82 by third contacts 86 which extend from the source region upwards to the first metal layer 82. The third contacts 86 may have a substantially strip-like form and may be positioned in approximately the centre of the continuous mesa 78 in regions of the continuous mesa 78 defined by the transverse portions 56 of the first trench 53 and intervening the third trenches 55. As the field plates within the first trench 53, the second trench 54 and the third trench 55 are electrically coupled to the overlying first metal layer 82 by first contacts 87, the field plates are coupled to source potential. The second and third trenches 54, 55 are connected and the field plates in the second and third trenches 54, 55 are connected. The field plate in the second trench 54 is coupled to the first metal layer 82 by the first contacts 87 positioned above the third trench 55 and extending to the field plate in the third trench 55.

FIG. 4 illustrates a semiconductor device 90 including a transistor device 91 arranged in a semiconductor body 92. The transistor device 91 includes an active region or cell field 93 and an edge termination region 94 which laterally surrounds the active region or cell field 93 on all sides. The cell field 93 includes a first serpentine trench 95 and a second serpentine trench 96 arranged in the semiconductor body 92. The first serpentine trench 95 is separate and laterally spaced apart from the second serpentine trench 96. A first field plate which cannot be seen in the top view of FIG. 4 is arranged in the first serpentine trench 95 and a second field plate which cannot be seen in the top view of FIG. 4 is arranged in the second serpentine trench 96. The transistor device 91 includes an edge termination trench 97 in the edge termination region 94. The edge termination trench 97 laterally surrounds both the first serpentine trench 95 and the second serpentine trench 96. The edge termination trench 97 is continuous and uninterrupted and is laterally spaced apart from the first serpentine trench 95 and the second serpentine trench 96. The edge termination trench 97 is substantially rectangular in plan view and includes two transverse portions 100, 100' connected by two longitudinal portions 101, 101'.

A first gate electrode is arranged in the first serpentine trench 95 which is electrically insulated from the first field plate and a second gate electrode is arranged in the second serpentine trench 96 which is electrically insulated from the second field plate. The edge termination trench 97 includes a third field plate and no gate electrode.

The first serpentine trench 95 includes transverse portions connected by longitudinal portions to form the meander or serpentine shape in plan view which includes a plurality of open-sided loops, whereby the open sides of adjacent loop face in opposing directions. Similarly, the second serpentine trench 96 includes transverse portions connected by longitudinal portions to form the meander or serpentine shape in plan view which includes a plurality of open-sided loops, whereby the open sides of adjacent loop face in opposing directions.

The semiconductor device 91 includes a further trench structure 98 including a longitudinal portion 99 which extends between and is connected to two opposing transverse portions 100, 100' of the edge termination trench 97 such that the first serpentine trench 95 is arranged between a first longitudinal portion 101 of the edge termination trench and the trench 99 and such that the second serpentine trench 96 is arranged on the opposing side of the trench 99 and between the trench 99 and the longitudinal trench 101' arranged on the opposing side to the first longitudinal trench 101.

The further trench structure 98 also includes transverse portions 102 which extend from opposing sides of the trench 99 substantially perpendicular to the trench 99 and parallel to transverse portions of the first serpentine trench 95 and of the second serpentine trench 96. The transverse portions 102 extend into the open ends of alternate loops of the first serpentine structure 95 and the second serpentine structure 96. Transverse portions 104 extend from longitudinal portion 101 of the edge termination trench 97 into the open end of alternate loops of the first serpentine structure 95. Transverse portions 104' also extend from the opposing longitudinal portion 101' of the edge termination trench 97 into the open end of alternate loops of the second serpentine structure 96.

The length of the transverse portions 104, 104' and the transverse portions 102 is such that the distal end of the transverse portions 104, 104' and the transverse portions 102 is spaced at a distance from the longitudinal portions of the first serpentine trench 95 and of second serpentine trench 96 and such that a first continuous mesa 105 is formed between the first serpentine trench 95, the edge termination trench 97 and the longitudinal portion 99 of the further trench structure 98 and such that a second continuous mesa 106 is formed between the second serpentine trench 96, the edge termination trench 97 and longitudinal portion 99 of the further trench structure 98.

FIG. 4 also illustrates the overlying metallic layers of the transistor device 91. In this embodiment, a first metallic layer 110 is arranged above the longitudinal portion 99, a second metallic layer 111 is arranged above the first serpentine trench 95 and a third metallic layer 112 is arranged above the second serpentine trench 96.

The first metallic layer 110 is electrically coupled to the gate electrode positioned in the first serpentine trench 95, in the second serpentine trench 96, in the transverse portions 102, in the longitudinal trench 99 and in the transverse portions 104, 104'. Contacts 113 extending from the first metallic layer 110 to the gate electrode may be laterally positioned in the longitudinal portion 99, distal ends of the transverse portions 104, 104' of the further trench structure 98 and in the longitudinal portions of the first serpentine trench 95 and of the second serpentine trench 96 that are positioned adjacent the longitudinal portion 99 of the further trench structure 98. The contacts 113 positioned at the distal end of the transverse portions 102 of the further trench structure 98 connect the field plate in the transverse portions 102 to the overlying metallic layers 111, 112 and to source potential.

The second metallic layer 111 is electrically coupled to source regions arranged in the continuous mesa 105 bounding the first serpentine trench 95. Elongate and continuous electrically conductive contacts 114 may be laterally arranged in the centre of the length of the mesa 105 formed between adjacent transverse portions 102 and the first serpentine trench 95 and between transverse portions 104, 104' and the first serpentine trench 95.

The third metallic layer 112 is electrically coupled to source regions arranged in the second continuous mesa 106 formed by the second serpentine trench 96. Elongate electrically conductive contacts 115 may be laterally arranged in the centre of the length of the mesa 106 formed between adjacent transverse portions 102 and the second serpentine trench 96 and transverse portions 104, 104' and the second serpentine trench 96.

The edge termination trench 97 may be coupled to source potential by electrically conductive contacts 116 extending between the longitudinal portion 101 and the first metallic layer 111 and by electrically conductive contacts 117 extending between the longitudinal portion 101' of the edge termination trench 97 and the second metallic layer 112.

In this embodiment, the metallic layer 110 electrically coupled to the gate electrodes is laterally arranged between two metal portions 111, 112 that are coupled to source potential.

FIG. 5 illustrates a simplified schematic top view of a semiconductor device 120 including a field effect transistor device 121 having a vertical drift path. The contacts to the source and body region in the mesa are not illustrated in this simplified view.

The transistor device 121 includes a first trench 122 having a meandering form which includes a plurality of open-sided loops 123. In the schematic view of FIG. 5, three loops 123 are illustrated which are formed by four transverse portions 124 and three longitudinal portions 125. However, in practice, the first trench 122 includes a much larger number of loops, for example the first trench 122 may include 50 loops, 100 loops or 1000 or more loops. In the schematic view of FIG. 5, the longitudinal portions 125 extend substantially perpendicular to the transverse portions 124. However, the shape and arrangement of the longitudinal portions may vary from that illustrated. For example, the closed end of the loops 123 may be formed by a longitudinal portion which has a curved form, for example a semicircular form or C-shape in plan view to achieve the purpose of connecting the transverse portions 124

Each loop 123 is formed by two neighbouring or immediately laterally adjacent transverse portions 124 which are arranged substantially parallel and spaced apart from one another and which are connected by a longitudinal portion 125 which extends substantially perpendicular to the two neighbouring transverse portions 124 in plan view. To provide the meandering form, the longitudinal portions 125 are arranged at opposing ends of the transverse portions 124 to provide a series of open-sided loops 123 with the closed sides formed by the longitudinal portions 125. The closed sides and, therefore, the open sides are arranged alternately at opposing ends of the transverse portions 124 to provide a meander or serpentine form.

The first trench 122 is laterally surrounded on all sides by a second trench 126 which has a substantially rectangular ring form and which is continuous. The transistor device 121 includes further trenches 127 which extend from the second trench 126 into the open ends of the loops 123 of the first trench 122. Adjacent ones of the further trenches 127 therefore, extend from opposing sides 128, 129 of the second trench 126. The second trench 126 and the further trenches 127 are laterally arranged with respect to the first trench 122 and its transverse portions 124 and longitudinal portions 125 such that a continuous mesa 131 is formed between the innermost wall 130 of the second trench 126 and between the side walls 132 of the first trench 122 and further trenches 127. The mesa 131 has a width which is substantially the same throughout its length.

The first trench 122, the second trench 126, the further trenches 127 and edge termination trenches 126, 133 are formed in the upper surface 134 of a semiconductor layer 135 of the semiconductor device 120 and extend substantially perpendicularly to the upper surface 134 of the semiconductor layer 135. The semiconductor layer 135 may be a silicon single crystal or an epitaxially deposited silicon layer having a monocrystalline structure, i.e. an epi layer. The semiconductor layer 135 forms the drift region of the field effect transistor device 121.

The second trench 126 forms an innermost one of a plurality of edge termination trenches 133 which are positioned laterally outward of the active region or cell field 138 of the transistor device 121. In the simplified view of FIG. 5, three edge termination trenches 126, 133 are illustrated. However, one, two or more than three edge termination trenches may be used. Each of the edge termination trenches 126, 133 has a continuous ring form. The trenches 133 laterally surround the second trench 126 and are spaced at a distance from it to form a ring-shaped mesa 153 between the second trench 126 and adjacent trench 133 and between adjacent one of the further edge termination trenches 133. The spacing between the edge termination trenches 126, 133 may be the same or may vary. In some embodiments, the spacing between adjacent ones of the edge termination trenches 133 may sequentially increase in directions laterally outwards from the innermost edge termination trench 126.

Also illustrated in the top view of FIG. 5, is a metal source finger 136 which extends perpendicularly across the further trenches 127 and transverse portions 124 of the first trench 122 and which extends substantially parallel with the longitudinal portions 125 of the first trench 122. The source finger 136 may be laterally positioned at around the centre of the length of the transverse portions 24 of the first trench 122. The metal source finger 136 may be coupled to a further metal source layer that is coupled to source regions of the transistor structure 121 and to field plates positioned within the first trench 122, the second trench 126 and the further trenches 127.

The semiconductor device 121 also includes a gate metal layer 137 which is positioned towards an edge of the semiconductor layer 135 and which is laterally spaced apart from, and extends substantially parallel to, the source finger 136. The metal gate layer 137 may have a lateral extent such that it is positioned directly above the distal ends of the further trenches 127, the longitudinal portions 125 of the first trench 122, the second trench 126 and may optionally over one or more of the further edge termination trenches 133.

FIG. 6 shows a cross-sectional view along the line A-A of FIG. 5 and illustrates the upper surface 134 of the semiconductor layer 135 as well as the opposing rear surface 140 of the semiconductor layer 135 which is formed by a substrate 141. The semiconductor layer 135 has a first conductivity type, for example n-type. The substrate 141 may include a layer highly doped with the first conductivity type which provides the drain of the field effect transistor 121. FIG. 6 illustrates the transverse portions 124 of the first trenches 122 and the further trenches 127 in the cell field 138 of the transistor device 121 and a plurality of trenches 126, 133 in the edge termination region 139 of the transistor device 121. The insert of FIG. 6 shows an enlarged view of transverse portions 124 of the first trenches 122 and the further trenches 127 in the cell field 138. The edge termination trenches 133 126, may have lateral dimensions which are substantially the same as or may be slightly wider than the trenches 124, 127 in the cell field 138.

In the cross-sectional view along the line A-A, the transverse portions 124 of the first trench 122 are interleaved by further trenches 127. Transverse portions 124 of the first trench 122 and the further trenches 127 each include a field plate 141 positioned towards the base of the trench 122, 127 and a gate electrode 142 arranged towards the top of the trench 124, 127. Each trench 124, 127 includes an insulating material 143 which lines the sidewalls 144 and base 145 of the trenches 124, 127 and insulating material 146 which extends between the field plate 141 and the gate electrode 142 and which electrically insulates the gate electrode 142 from the field plate 141. The upper portion of the trench 124, 127 also includes insulating material 147 lining the sidewalls 144 which forms a gate oxide.

The mesa 131 formed between adjacent trenches 124, 127 includes a body region 148 doped with the second conductivity type, which opposes the first conductivity type, and a source region 149 arranged on the body region 148. The source region 149 is doped with the first conductivity type as is the semiconductor layer 135 which provides the drift region of the transistor device 121. If the source region 149 is n-type, the body region 148 is p-type. Mesas 153 are formed between laterally adjacent edge termination trenches 126, 133 which have a continuous ring form. The mesas 153 in the edge termination region 139 may include a body region 148' and no source region. The electrical connection between the source metal layer and the source region 149 and the body region 148 in the mesa 131 is also illustrated in FIG. 6.

At least one electrically insulating layer 150 is arranged on the first major surface 134 such that it covers the upper surface of the gate electrode 147 and source region 149 in the cell field 138. The one or more insulating layers 150 also cover the upper surface 134 of the semiconductor layer 135 in the edge termination region 139 and, therefore, the body regions 147 forming the upper portion of the mesas 153. In some embodiments, the one or more insulating layers 150 extend into the trenches 126, 133 in the edge termination region 139 to a greater depth than into the trenches 122, 127 in the cell field 138, if the trenches 126, 133 an the edge termination region 139 do not include a gate electrode and the field plate is recessed within the trenches 126, 133. In some embodiments, the field plate may extend to the upper surface 134 of the semiconductor layer 135 in the edge termination region 139.

The one or more insulation layers 150 may be conformally deposited onto the first major surface 134 and may extend from the first major surface 143 into the semiconductor layer 135, in particular into the edge termination trenches 126, 133 to a depth or distance from the first major surface 134 which is greater in the edge termination region 139 than in the cell field 138. One or more metallic layers 151 are arranged on the one or more insulating layers 150.

To provide an electrical connection to the source region 149 and the body region 148, one or more electrically conductive contacts 152 are formed which extend through the insulating layer or layers 150 and which may extend into the upper surface of the mesa 131 formed between adjacent trenches 124, 127. The contact 152 may include an elongate opening in the insulating layer or layers 150 which has a base positioned within the body region 148. The openings may be lined with one or more metal layers 151' and may be filled by one or more further metal layers 151. The metal layers 151, 151' extend over the upper surface of the insulating layers 150.

The contacts 152 have an elongate shape and extend into the upper surface of the mesa 131 formed between adjacent trenches 124, 127. The contacts 152 are positioned in regions of the mesa 131 adjacent the gate finger 137' and are interrupted in the region of the mesa underneath the gate finger 137'. The contacts 152 may also be interrupted and not present in regions of the mesa 131 that are positioned under source metal layer 136.

In the view of the edge termination region 139 illustrated in FIG. 6, the metal layers 151, 151' are spaced apart from the field plates 141 in the trenches 126, 133 and also spaced apart from the body regions 148' formed in the mesa 153 formed between the edge termination trenches 133 by the insulating layers 150. The field plates 141 in the trenches 126, 133 are connected to source potential at a position which cannot be seen in the cross-sectional view of FIG. 6, for example at one or more positions in a plane in front and/or behind the plane of the drawing.

An electrical connection to the body region 148' in one or more of the mesas 153 in the edge termination region 139 may be formed at a lateral position between the outermost trench of the cell field 138 and the innermost trench of the edge termination region 139. The electrical connection to the body region 148' of the edge termination region 139 may be formed by positioning a contact 152' comprising an opening through the insulating layers 150 which extends into the semiconductor layer 135 and has a base positioned in the body region 148' in the edge termination region 139. The opening may be lined and/or filled with one or more metal layers 151, 151'. The metal layers 151, 151' also extend into the body regions 148 and source regions 149 in the mesa 131 in the active area 138. This arrangement allows the body region 148' forming part of the edge termination structure 139 to be electrically coupled to source potential.

A more highly doped zone 154 of the second conductivity type may be formed at the base of the openings in the body region 148, 148' in both the cell field 138 and in the edge termination region 139. The more highly doped zone may assist in providing a contact to the body region 148, 148'.

The metal layers 151, 151' have a lateral extent such that they extend from, and in some embodiments throughout, the active area 138 and into the edge termination region 139. One or more of the outermost edge termination trenches 133 may remain uncovered by the one or more metal layers 151.

FIG. 7 illustrates a cross-sectional view along the line B-B of FIG. 5 and illustrates a portion of the transistor device 121 including the cell field 138 and edge termination region 139. FIG. 7 illustrates the connection between the gate electrodes 142 in the first trench 122 and in the further trenches 127 with an overlying gate metal layer 137.

In this portion of the semiconductor device 121, in a region within the innermost edge termination trench 126, the mesa 131 fails to include a source region 149 on the body region so that the body region 148 forms the first major surface 134. At this position of the transistor device 121, the one or more insulating layers 150 are arranged on the first major surface 134 and cover the body regions 148 in the ring-shaped mesa 153 in the edge termination region 139, uppermost portions of the edge termination trenches 133, and the body regions 148 arranged at the top of the mesa 131 defined by the trenches 124, 127. The continuous mesa 131 is covered by one or more insulating layers 150.

A plurality of openings 155 are provided which extend through the insulating layers 150 to the gate electrode 142 arranged in the transverse portions 124 of the first trench 124 and in the further trench 127. The openings 155 may extend into the gate electrode 142 such that the base and adjoining portions of the sidewall of the opening 155 are formed by the gate electrode. One or more metal layers 157 are arranged on the insulating layers 150 and at least line the sidewalls of the openings 155. One or more further conductive layers 158 are arranged on the conductive layer 157 and may fill the openings 155 to provide a conductive contact to the gate electrodes 142. The openings 155 may be elongate and extend into the plane of the drawing. The openings 155 are arranged substantially parallel to one another in each of the substantially parallel arranged transverse portions 124 of the first trench 122 and further trenches 127. As can be seen in the top view of FIG. 5, the metal layer 137 is separate from and laterally spaced apart from the metallic layer 151 of the source layer 136.

In some embodiments, the transistor device 121 may include one or more gate fingers 137' in addition to or in place of the gate metal 137. The gate finger 137' is laterally positioned in the active area 138 and includes a metal layer 137'. Like the gate metal layer 137 at the periphery of the active area 138, a plurality of openings is provided which extend through the insulating layers to the gate electrode arranged in the transverse portions 124 of the first trench 124 and in the further trench 127.

FIG. 8 illustrates a cross-sectional view along the line C-C of FIG. 5 and illustrates the electrical connection between the source metal layer 151 arranged on the first major surface 134 and the field plate 141 arranged in the transverse portions 124 of the first trench 122 in the cell field 138 of the transistor device 121. At this lateral position, the transverse portions 124 of the first trench 122 and the further trenches 127 include a field plate 141 but no gate electrode. Additionally, the uppermost portion of the mesa 131 includes a body region 148 which extends to the uppermost surface 134 in the cell field 138. At this lateral position of the transverse portions 124 of the first trench 122 and of the further trenches 127, the insulating material 150 extends into the edge termination trenches 133 and into the upper portion of the transverse portions 124 of the first trench 122 of the further trenches 127.

Openings 160 are arranged in the insulative material 150 which extend through the insulating material 150 to the field plate 141 positioned in the transverse portions 124 of the first trench 122. These openings 160 are lined with one or more metal layers 157 and filled with one or more further metal layers 158 to provide an electrical connection between the source metal layer 151 and the field plate 144 in the transverse portions 124 of the first trenches 122. In the view illustrated in FIG. 8, the openings 160 extend into alternate trenches since the transverse portions 124 of the first trench alternate with the further trenches 127.

In some embodiments, openings 160 are positioned such that they extend to the field plate 141 in the further trenches 127. The openings 160 are lined and optionally filled with one or more metallic layers which are also coupled to the metal layer 151. In some layer embodiments, these openings providing the electrical connection to the field plate 141 in the further trenches 127 are laterally arranged in a single common row with the openings 160 extending to the field plates 141 in the transverse portions 124 of the first trench 122. In other embodiments, such as that illustrated in FIG. 8, the openings 160 extending to the field plate 141 in the further trenches 127 are arranged laterally spaced apart from the openings 160 extending to the field plates 141 in the transverse portions 124 first trench 122. For example, these openings may be arranged in the plane behind or in front of that illustrated in FIG. 8.

FIG. 9 illustrates a cross-sectional view along the line D-D of FIG. 5 and illustrates a region of the further trenches 127 and transverse portions 124 of the first trench 122 in the edge termination region 139. At this lateral position, none of the trenches 124, 127 includes a gate electrode and the uppermost surface of the mesas 131, 153 does not include a source region. The uppermost surface of the continuous mesa 131 and the ring-shaped mesas 153 are formed by a region 148' including the second conductivity type. This region 148' may be thought of as a body region and fabricated with the body region 148 of the cell field 138. The uppermost portions of the edge termination trenches 126, 133, transverse portions 124 of the first trench 122 and of the further trenches 127 are filled with insulating material 150 which extends from the first major surface 134 into the trenches 122, 127, 133. The gate metal layer 137 is arranged on top of the insulating material 150.

FIG. 10 illustrates a cross-sectional view along the line E-E of FIG. 5 and illustrates a cross-sectional view along the length of a transverse portion 124 of the first trench 122, a width of a longitudinal portion 129 of the second trench 126 and a width of the edge termination trenches 126, 133. As can be seen in this cross-sectional view along the length of a first trench 124, the field plate 141 and the gate electrode 142 have an elongate shape and are spaced apart from one another by insulating material 146. The outermost portion of the first trench 122 which is formed by the longitudinal portion 125 fails to include a gate electrode so that the laterally outermost portion of the first trench 122 includes only the field plate 141 and insulating material 150. One or more openings 156 may be formed through the insulative material 150 to expose regions of the gate electrode 142 to enable electrical connection to the gate electrode 142 by means of an electrically conductive contact 159.

The field plate 141 arranged in the second trench 126 and in the edge termination trenches 133 are covered by and electrically insulated from the metallic layer 137 by the insulating material 150. In some embodiments, such as that illustrated in FIG. 10, one or more outermost edge termination trenches 133' may include a gate electrode 142'. However, this gate electrode 142' is not coupled to an external potential and may be considered to be a dummy gate electrode. Furthermore, the regions of the semiconductor layer 135 forming the ring-shaped mesas 153 between the edge termination trenches 133 do not include a source region, but may be doped with the second conductivity type and form dummy body regions 148'.

Spatially relative terms such as "under", "below", "lower", "over", "upper" and the like are used for ease or description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
  a transistor device, comprising:
    a semiconductor body comprising a first major surface;
    a first trench in the first major surface, the first trench having at least two transverse portions that are spaced apart by a distance, wherein adjacent ones of the transverse portions are connected by a longitudinal portion such that the first trench has a meandering form;
    a second trench in the first major surface, the second trench laterally enclosing the first trench;
    a third trench in the first major surface, wherein the third trench extends from the second trench between two transverse portions of the first trench and has a distal end spaced apart from the longitudinal portion of the first trench that connects the two transverse portions;
    a continuous mesa formed between the first trench, the second trench and the third trench; and
    a field plate and a gate electrode in each of the first trench and the third trench.
2. The semiconductor device of claim 1, wherein the second trench comprises no electrode that is coupled to gate potential.

3. The semiconductor device of claim 1, further comprising a source region arranged in a body region in the continuous mesa in portions formed by the first trench and the third trench.

4. The semiconductor device of claim 3, wherein the body region extends to the first major surface in regions adjacent the second trench and forms an edge termination structure together with the second trench.

5. The semiconductor device of claim 1, further comprising dielectric material, wherein the dielectric material extends from the first major surface into the second trench by a depth that is greater than a depth of the dielectric material extending from the first major surface into the first trench and into the third trench.

6. The semiconductor device of claim 1, further comprising a first metal layer and first contacts extending from the first metal layer to the field plate in the first trench and to the field pate in the third trench.

7. The semiconductor device of claim 6, further comprising a second metal layer and second contacts extending from the second metal layer to the gate electrode in the first trench and to the gate electrode in the third trench, the second metal layer being spaced apart from the first metal layer.

8. The semiconductor device of claim 7, further comprising:
a source region arranged in a body region in the continuous mesa in portions formed by the first trench and the third trench; and
a third metal layer and at least one third contact, the third contact extending from the third metal layer to the continuous mesa and being electrically coupled with the source region.

9. The semiconductor device of claim 8, further comprising at least one fourth contact extending from the third metal layer to the body region adjacent the second trench.

10. The semiconductor device of claim 1, further comprising:
a first metal layer and first contacts extending from the first metal layer to the field plate in the first trench and the third trench;
at least one third contact extending from the first metal layer to the continuous mesa and being electrically coupled with a source region; and
at least one fourth contact extending from the first metal layer to a body region adjacent the second trench.

11. The semiconductor device of claim 1, further comprising a metal source finger that extends over the first trench and the third trench and comprises one or more contacts extending from the metal source finger to the field plate in the first trench and to the field plate in the third trench.

12. The semiconductor device of claim 11, wherein the one or more contacts are arranged in a first row and a second row, each contact in the first row being electrically coupled to the field plate in the first trench and each contact in the second row being electrically coupled to the field plate in the third trench.

13. The semiconductor device of claim 1, further comprising one or more further trenches in the first major surface that laterally enclose the second trench.

14. The semiconductor device of claim 13, wherein the semiconductor body has a first conductivity type and the one or more further trenches are separated from the second trench and one another by a mesa having the second conductivity type at the first major surface.

15. The semiconductor device of claim 14, wherein the one or more further trenches comprise a field plate and no gate electrode and insulation material that extends into the second trench and the one or more further trenches by a depth that is greater than a depth that the insulation layer extends into the first trench and into the third trench.

16. A semiconductor device, comprising:
a semiconductor body comprising a field effect transistor device comprising an active region and an edge termination region that surrounds the active region on all sides,
the active region comprising:
a first serpentine trench in the semiconductor body;
a first field plate in the first serpentine trench;
a second serpentine trench in the semiconductor body; and
a second field plate in the second serpentine trench,
wherein the first serpentine trench is separate and laterally spaced apart from the second serpentine trench.

17. The semiconductor device of claim 16, further comprising:
a first gate electrode arranged in the first serpentine trench and electrically insulated from the first field plate; and
a second gate electrode arranged in the second serpentine trench and electrically insulated from the second field plate.

18. The semiconductor device of claim 16, wherein the edge termination region comprises an edge termination trench that surrounds the first serpentine trench and the second serpentine trench, wherein the edge termination trench comprises a third field plate and no gate electrode, and wherein a doped zone of a second conductivity type adjoins the edge termination trench.

19. The semiconductor device of claim 18, further comprising transverse trenches extending from the edge termination trench into alternate loops of the first serpentine trench and into alternate loops of the second serpentine trench.

20. The semiconductor device of claim 16, further comprising a trench structure comprising a longitudinal portion that extends into the semiconductor body in a region between the first serpentine trench and the second serpentine trench, and transverse portions that extend from opposing sides of the longitudinal portion into alternate loops of the first serpentine trench and into alternate loops of the second serpentine trench.

* * * * *